United States Patent [19]
Matlo

[11] Patent Number: 5,962,932
[45] Date of Patent: Oct. 5, 1999

[54] POWER SUPPLY APPARATUS WITH CIRCUIT LOAD SENSOR

[76] Inventor: Darryl Matlo, 156 Westchester Bay, Chestermere, Canada, AB T1X 1C9

[21] Appl. No.: 08/935,291

[22] Filed: Sep. 22, 1997

[51] Int. Cl.[6] .................................................. H01H 35/00
[52] U.S. Cl. ........................... 307/126; 307/125; 307/98; 307/99; 361/88; 361/93
[58] Field of Search ................................ 307/98, 99, 126, 307/127; 340/680; 361/88, 93

[56] References Cited

U.S. PATENT DOCUMENTS

| | | | |
|---|---|---|---|
| 3,683,198 | 8/1972 | Thode | 307/66 |
| 4,466,040 | 8/1984 | Barthel et al. | 361/92 |
| 4,853,821 | 8/1989 | Lewis | 361/92 |
| 5,579,192 | 11/1996 | Lee | 361/18 |
| 5,629,571 | 5/1997 | Roudeski | 307/130 |

*Primary Examiner*—Jeffrey Gaffin
*Assistant Examiner*—Peter Zura
*Attorney, Agent, or Firm*—David S. Thompson

[57] ABSTRACT

A power supply apparatus 10 with circuit load sensor provides an extension cord 20 having first and second ends extending from an enclosure 30. Within the enclosure, a power supply indicator circuit 40 lights an LED in response to the plug of the extension cord being inserted into a live outlet. Also within the enclosure, a power consumption indicator circuit 60 lights an LED in response to consumption of power by a load plugged into the socket of the extension cord. A nominal voltage drop across a TRIAC 70, carried in-line with the neutral conductor within the enclosure, triggers the power consumption indicator circuit when the load draws current.

1 Claim, 2 Drawing Sheets

5,962,932

POWER SUPPLY APPARATUS WITH CIRCUIT LOAD SENSOR

BACKGROUND

When an extension cord, power strip or similar electrical power supply device is used there is frequently an issue as to whether the electrical power supply device is operatively connected to power. Similarly, when a load is either remote from the end of the power supply device at which the operator is located, or where the power-consuming load is silent, such as a car's block heater or battery charger, there is an issue as to whether the power-consuming device is properly attached and drawing current.

What is needed is a inexpensive and reliable way for the operator to determine if the power supply device is attached to an operative power supply and if the load is operative and drawing current.

SUMMARY

The present invention is directed to an apparatus that satisfies the above needs. A novel power supply apparatus with circuit load sensor is disclosed that provides an operator with indicator LEDs confirming that the apparatus is connected to power and that the load is drawing power.

The power supply apparatus of the present invention provides some or all of the following structures.

(A) An extension cord provides an electrical cord body having "hot" and "neutral" conductors, a first end having a standard electrical plug and a second end having a standard electrical socket.

(B) An enclosure, having input "hot" and "neutral" terminals electrically attached to the first end of the cord body having the standard electrical plug, and having output "hot and "neutral" terminals electrically attached to the second end of the cord body having the standard electrical socket.

(C) A power supply indicator circuit, carried between the "hot" and "neutral" conductors, is adapted so that an LED indicator of the circuit is lit when the standard electrical plug is inserted in a live electrical outlet.

(D) A power consumption indicator circuit, carried between the "hot" and "neutral" conductors, is adapted so that an LED indicator of the circuit is lit when a load plugged into the standard electrical socket is drawing power.

(E) A TRIAC, carried in-line with the "neutral" conductor, between the input and output neutral terminals within the enclosure, whereby a nominal voltage drop across the TRIAC allows operation of the power consumption indicator circuit.

It is therefore a primary advantage of the present invention to provide a novel power supply apparatus having a power supply indicator circuit having an LED indicator which lights to indicate that the apparatus is plugged into an operational power supply.

Another advantage of the present invention is to provide a novel power supply apparatus having a power consumption indicator circuit having an LED indicator which indicates that a load plugged into the apparatus is drawing current.

A still further advantage of the present invention is to provide a novel power supply apparatus which consumes minimal power and which results in a negligible drop in line voltage.

DRAWINGS

These and other features, aspects, and advantages of the present invention will become better understood with regard to the following description, appended claims, and accompanying drawings where:

DESCRIPTION

Figure 1:
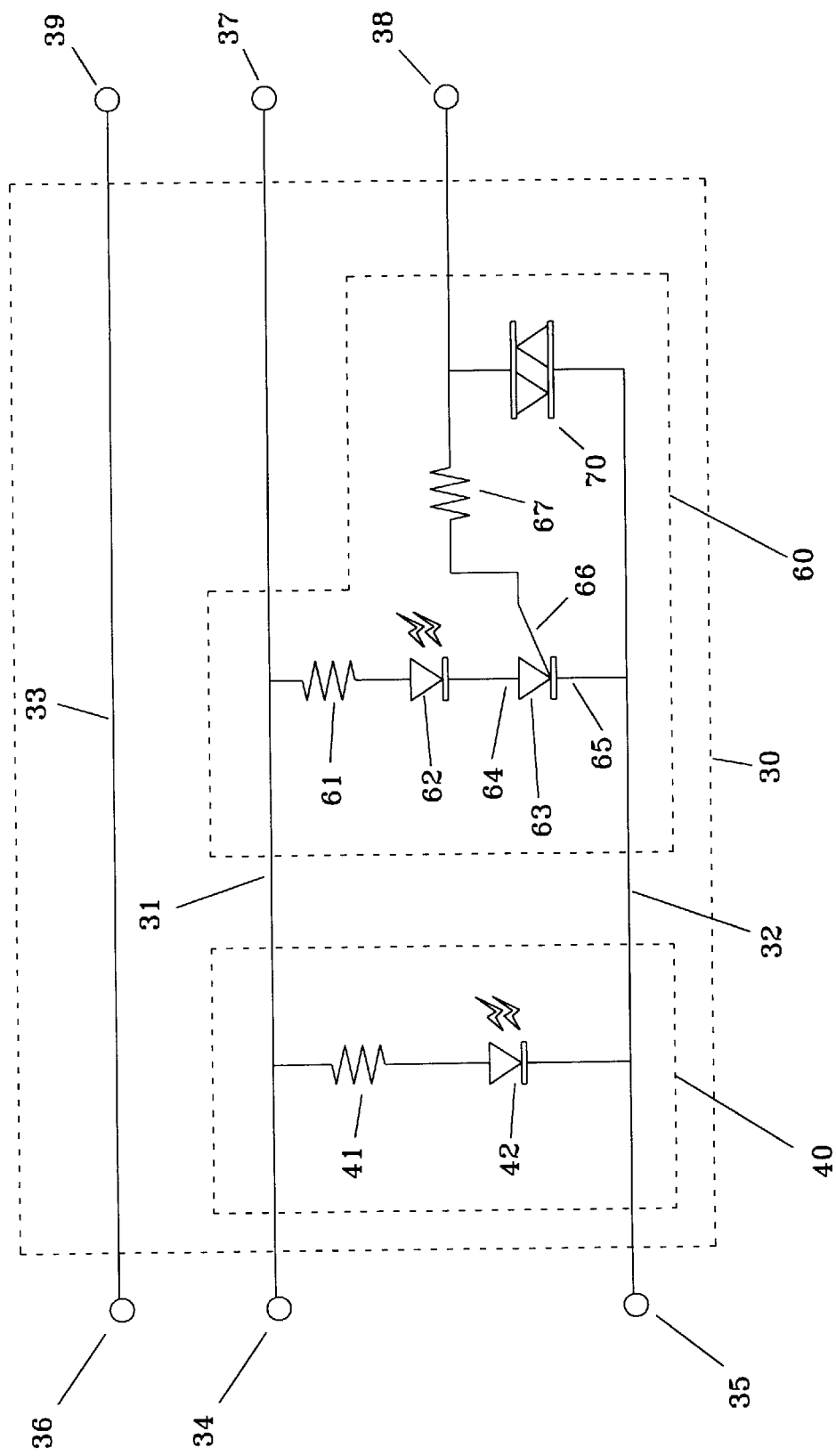
FIG. 1 is a view of a circuit diagram disclosing the operation of the power supply apparatus with circuit load sensor.
Figure 2:
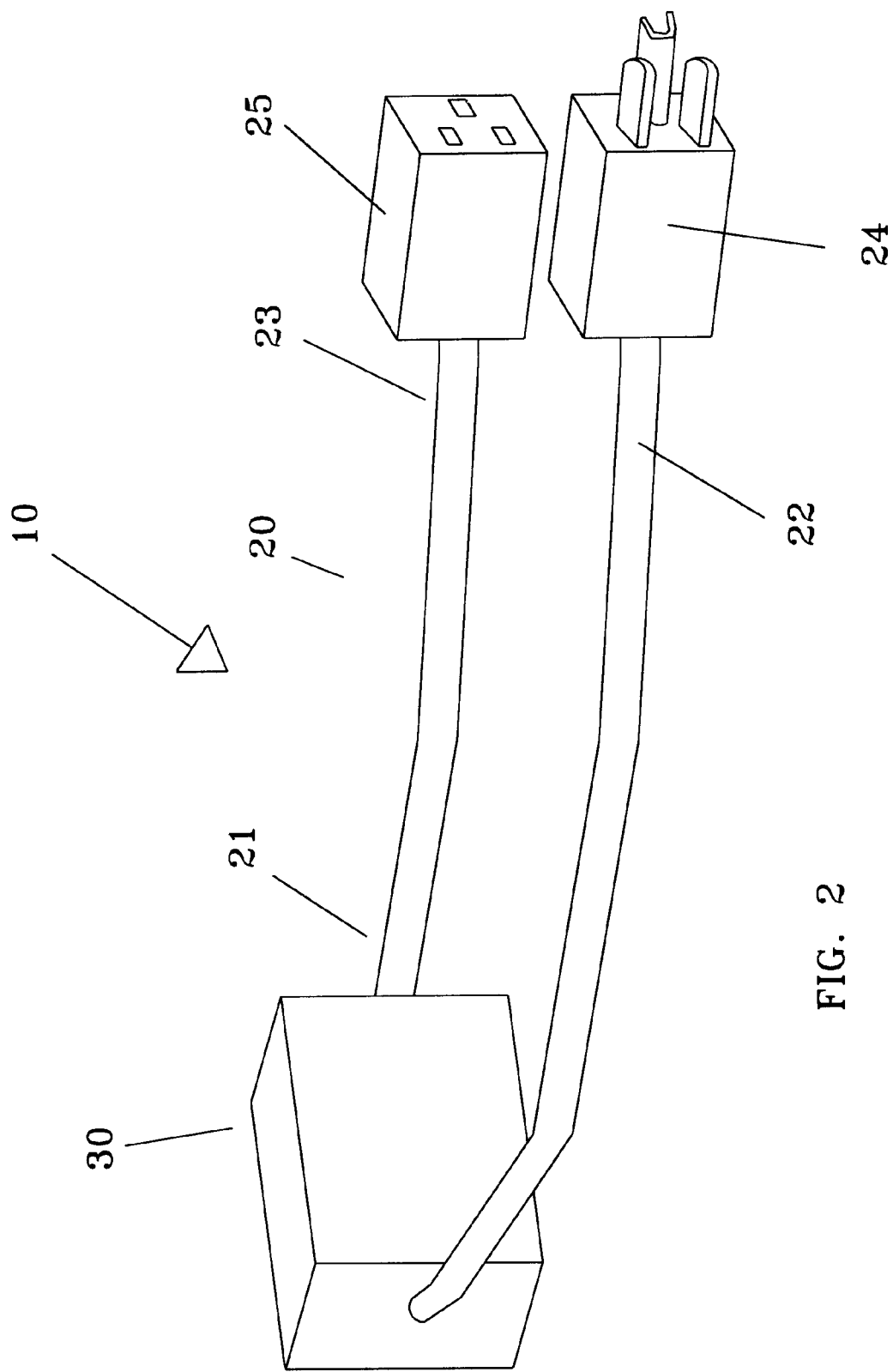
FIG. 2 is a perspective view of a version of the power supply apparatus with circuit load sensor, having a generally extension cord appearance.

Referring in generally to FIGS. 1 and 2, a power supply apparatus with circuit load sensor 10 constructed in accordance with the principles of the invention is seen. The power supply apparatus includes an extension cord 20 having first and second ends extending from an enclosure 30. Within the enclosure, a power supply indicator circuit 40 lights an LED in response to the plug of the extension cord being inserted into a live outlet. Also within the enclosure, a power consumption indicator circuit 60 lights an LED in response to consumption of power by a load plugged into the socket of the extension cord. A nominal voltage drop across a TRIAC 70, carried in-line with the neutral conductor within the enclosure, triggers the power consumption indicator circuit when the load draws current.

As seen in FIG. 2, an extension cord 20 provides an electrical cord 21 typically having three conductors for "hot," "neutral" and "ground", and having first and second ends 22, 23 carrying a standard 3-prong plug 24 and a standard 3-prong socket 25, respectively.

As seen in FIG. 2, an enclosure 30 is carried between the first and second ends 22, 23 of the extension cord 20. The enclosure provides hot, neutral and ground conductors 31, 32, 33, as seen in FIG. 1. Input terminals 34, 35 and 36 are associated with the hot, neutral and ground conductors, respectively. Output terminals 37, 38, 39 are associated with the hot, neutral and ground conductors, respectively.

Referring in particular to FIG. 1, the structure of the circuitry carried within the enclosure may be understood. A power supply indicator circuit 40 is indicated within the dotted lines. A current-limiting resistor 41, and an LED 42, are carried in series between the hot and neutral conductors 31, 32. The resistor 41 is typically 47k Ohm, rated at 2% tolerance and ½ Watt, but alternate values may be substituted within reason, to control the brightness of the LED 42. The LED is typically red, but may be another color if desired.

The operation of the power supply indicator circuit 40 is easily understood. When the plug 24 of the extension cord 20 is plugged into an active AC current outlet, current passes through the resistor 41 and LED 42, causing the LED to light. The lit LED is an indicator to the user that the plug is correctly installed in a live outlet.

Continuing to refer to FIG. 1, the structure of a power consumption indicator circuit 60 carried within the enclosure may be understood. The power consumption indicator circuit 60 is indicated within the dotted lines. A current-limiting resistor 61, an LED 62 and a silicon control controlled rectifier (SCR) 63 are carried in series between the hot conductor 31 and a portion on the neutral conductor 32 between the input neutral terminal 35 and the point of attachment of the TRIAC 70 to the neutral conductor. The resistor is typically 47k Ohm, rated at 2% tolerance and ½ Watt, but alternate values may be substituted within reason, to control the brightness of the LED 62. The LED 62 is typically green, but may be another color if desired. The SCR 63 is typically an NTE 5404, but may be substituted with a similar component. In assembly, the anode 64 of the SCR 63 is oriented to the hot conductor 31, while the cathode 65 is oriented toward the neutral conductor 32.

Continuing to refer to FIG. 1, the gate lead 66, extending from the SCR 63 is connected to a current-limiting resistor 67 which in turn is connected to the output neutral terminal 38. The current-limiting resistor 67 is typically 47k Ohm, rated at 2% tolerance and ½ Watt, but my be selected from other values which are consistent with the gate requirements of the SCR selected.

As seen in FIG. 1, a TRIAC 70 is carried in-line with the neutral conductor between the output neutral terminal 38 and the point on the neutral conductor within the enclosure to which the series-wired resistor 62, LED 62 and SCR 63 are attached. A preferred TRIAC is the NTE 5815, but other similar TRIACs from other manufacturers may be substituted, where their performance characteristics are similar.

The operation of the power consumption indicator circuit 60 may be understood by reference to FIG. 1 and the following discussion. With the plug 24 in a live AC outlet, and the LED 42 lit, the user may then plug a load into the socket 25. Where the load it silent, as a car's cold weather engine block heater, there would ordinarily be an issue as to the heater's operation.

When the load is drawing current, a nominal voltage drop of approximately 0.9 volts results across the TRIAC 70. This voltage drop results in a change in the voltage potential on the gate 66 of the SCR 63. As a result, the SCR changes to a conductive state, allowing current to pass through the LED 62 causing it to light.

When the load is not drawing current, there is no voltage drop across the TRIAC 70, and the voltage potential of the gate 66 is such that the SCR is in a non-conductive state and the LED 62 is not lit.

The invention resides not in any one of these features per se, but rather in the particular combination of all of them herein disclosed and claimed and it is distinguished from the prior art in this particular combination of all of its structures for the functions specified.

Although the present invention has been described in considerable detail and with reference to certain preferred versions, other versions are possible. For example, while preferred component manufacturers and part numbers have been supplied, similar parts could be substituted. Therefore, the spirit and scope of the appended claims should not be limited to the description of the preferred versions disclosed.

In compliance with the U.S. Patent Laws, the invention has been described in language more or less specific as to methodical features. The invention is not, however, limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A power supply apparatus for indicating the presence of electrical power in an electrical outlet, and for indicating that a load plugged into the power supply apparatus is drawing power, the power supply apparatus comprising:

(A) an electrical cord body having hot and neutral wires, a first end having a standard electrical plug and a second end having a standard electrical socket;

(B) an enclosure, having input hot and neutral terminals electrically attached to the first end of the cord body having the standard electrical plug, and having output hot and neutral terminals electrically attached to the second end of the cord body having the standard electrical socket, and having hot and neutral conductors carried between the input and output terminals;

(C) power supply indicator circuit means, carried between the hot and neutral conductors within the enclosure, for annunciating when the standard electrical plug is inserted into the electrical outlet, the power supply indicator circuit means comprising a first current-limiting resistor and a first LED, wired in series;

(D) power consumption indicator circuit means, carried between a point on the hot conductor and a point on the neutral conductor within the enclosure, for annunciating when the load plugged into the standard electrical socket is drawing power, the power consumption indicator circuit means comprising:

(a) a second current-limiting resistor, a second LED and an SCR wired in series between the hot and neutral conductors; and (b) a gate lead, carried by the SCR, connected to a third current-limiting resistor, and therethrough to the output neutral terminal attached to the second end of the cord having the standard electrical socket; and (E) a TRIAC, carried in-line with the neutral conductor between the output neutral terminal and the point on the neutral conductor within the enclosure to which the series-wired second current-limiting resistor, second LED and SCR are attached, whereby a nominal voltage drop across the TRIAC, caused by current consumption in the load results in a change in the electrical potential of the gate lead, thereby causing the SCR to become conductive and causing the second LED to turn on.

\* \* \* \* \*